(12) United States Patent
Cardozo et al.

(10) Patent No.: US 11,125,792 B2
(45) Date of Patent: Sep. 21, 2021

(54) POWER OUTAGE DETECTION AND REPORTING

(71) Applicant: Landis+Gyr Innovations, Inc., Alpharetta, GA (US)

(72) Inventors: Ruben E. Salazar Cardozo, Johns Creek, GA (US); James Randall Turner, Alpharetta, GA (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 0 days.

(21) Appl. No.: 16/887,950

(22) Filed: May 29, 2020

(65) Prior Publication Data
US 2020/0379023 A1 Dec. 3, 2020

Related U.S. Application Data

(60) Provisional application No. 62/854,553, filed on May 30, 2019.

(51) Int. Cl.
*H04L 12/26* (2006.01)
*H04L 29/08* (2006.01)
(Continued)

(52) U.S. Cl.
CPC .......... *G01R 22/068* (2013.01); *G01R 31/08* (2013.01); *H02H 1/0007* (2013.01); *H02H 3/04* (2013.01);
(Continued)

(58) Field of Classification Search
CPC ... H04L 69/40; H04L 61/2046; H04L 43/106; H02H 1/0007; H04B 10/27; H04B 10/25; H04B 5/00
See application file for complete search history.

(56) References Cited

U.S. PATENT DOCUMENTS 6,332,072 B1 12/2001 Johnson et al.
9,679,255 B1 * 6/2017 Mullaly ............... G08B 29/186
(Continued)

FOREIGN PATENT DOCUMENTS

WO 2008033514 3/2008

OTHER PUBLICATIONS

U.S. Appl. No. 16/211,867, Non-Final Office Action dated Feb. 28, 2020, 35 pages.
(Continued)

*Primary Examiner* — Iqbal Zaidi
(74) *Attorney, Agent, or Firm* — Kilpatrick Townsend & Stockton LLP

(57) ABSTRACT

Systems and methods are disclosed for detecting and reporting node power outages in a connected network. A node in the network detects that a power outage has occurred at the node and the node generates a last gasp packet using a packet format containing fewer data units than a regular packet format used by the network for communication. The node broadcasts the last gasp packet to its neighboring nodes. After receiving the last gasp packet, a neighboring node estimates the time of the power outage and converts the last gasp packet into an outage alarm message using the regular packet format. The neighboring node transmits the outage alarm message to a headend system to report the power outage at the node.

20 Claims, 5 Drawing Sheets

(51) Int. Cl.
| | |
|---|---|
| *H04W 24/04* | (2009.01) |
| *H04W 24/08* | (2009.01) |
| *H04B 1/69* | (2011.01) |
| *H04W 84/18* | (2009.01) |
| *G01R 22/06* | (2006.01) |
| *G01R 31/08* | (2020.01) |
| *H02H 1/00* | (2006.01) |
| *H02H 3/04* | (2006.01) |

(52) U.S. Cl.
CPC .......... *H04L 43/106* (2013.01); *H04L 69/324* (2013.01); *H04W 24/04* (2013.01); *H04W 24/08* (2013.01); *H04B 2001/6908* (2013.01); *H04W 84/18* (2013.01)

(56) References Cited

U.S. PATENT DOCUMENTS

| | | |
|---|---|---|
| 10,056,159 B1 | 8/2018 | Patel et al. |
| 2005/0044211 A1 | 2/2005 | Adhikari |
| 2010/0172258 A1 | 7/2010 | Yang et al. |
| 2012/0192025 A1 | 7/2012 | Veillette |
| 2013/0166641 A1 | 6/2013 | Kan et al. |
| 2014/0085105 A1 | 3/2014 | Vaswani et al. |
| 2014/0105037 A1 | 4/2014 | Manthiramoorthy |
| 2016/0226575 A1* | 8/2016 | Subramani ........... H04B 7/2643 |
| 2017/0070563 A1 | 3/2017 | Sundermeyer et al. |
| 2017/0134395 A1 | 5/2017 | Enns et al. |
| 2017/0272317 A1 | 9/2017 | Singla et al. |
| 2017/0310396 A1* | 10/2017 | Yoshizawa ....... H04B 10/07955 |
| 2018/0091989 A1 | 3/2018 | Baroudi et al. |
| 2018/0196972 A1 | 7/2018 | Lu et al. |
| 2018/0212568 A1 | 7/2018 | Chu et al. |
| 2018/0263008 A1 | 9/2018 | Poorrezaei |
| 2018/0331914 A1 | 11/2018 | Yoshida et al. |
| 2019/0028986 A1 | 1/2019 | Poorrezaei et al. |
| 2019/0104056 A1 | 4/2019 | Poorrezaei et al. |
| 2019/0246329 A1 | 8/2019 | Abouelmaati et al. |
| 2020/0022005 A1 | 1/2020 | Campos et al. |
| 2020/0106582 A1 | 4/2020 | Jalali |
| 2020/0170074 A1 | 5/2020 | Klausen et al. |

OTHER PUBLICATIONS

Li et al., "Robust Networking for Bandwidth Constrained Mobile Tactical Radio", IEEE 75th Vehicular Technology Conference (VTC Spring), May 6, 2012, 5 pages.

Mccarthy et al., "An Efficient Broadcast Query Forwarding Technique for Wireless Multipath Routing", 24th IEEE International Performance, Computing, and Communications Conference, Apr. 7, 2005, pp. 337-346.

International Patent Application No. PCT/US2019/064127, Partial Search Report dated Mar. 19, 2020, 13 pages.

Uchiyama et al., "Neighbor Selection Algorithm for Ad Hoc Networks with Highly Dynamic Urban Mobility", Wireless Communications and Mobile Computing, IWCMC, International, IEEE, Aug. 6, 2008, pp. 165-170.

International Patent Application No. PCT/US2020/035248, Invitation to Pay Additional Fees and Partial Search Report, dated Sep. 16, 2020, 14 pages.

International Patent Application No. PCT PCT/US2020/035256, International Search Report and Written Opinion, dated Oct. 6, 2020, 16 pages.

International Patent Application No. PCT PCT/US2020/035282, International Search Report and Written Opinion, dated Sep. 24, 2020, 13 pages.

U.S. Appl. No. 16/836,164, Non-Final Office Action dated Mar. 4, 2021, 7 pages.

U.S. Appl. No. 16/836,200, Notice of Allowance dated Mar. 24, 2021, 19 pages.

U.S. Appl. No. 16/211,867, Notice of Allowance dated Jan. 22, 2021, 19 pages.

U.S. Appl. No. 16/836,164, Notice of Allowance dated Jan. 26, 2021, 8 pages.

U.S. Appl. No. 16/211,867, Non-Final Office Action dated Aug. 12, 2020, 39 pages.

\* cited by examiner

LAST GASP PACKET 118

| PHY HEADER (6 BYTES) | MAC HEADER (11 BYTES) | LAST GASP INFO (8 BYTES) |
|---|---|---|

OUTAGE ALARM MESSAGE 108

| PHY HEADER (6 BYTES) | MAC HEADER (11 BYTES) | IP HEADER (4 BYTES) | UDP HEADER (8 BYTES) | APPLICATION HEADER (6 BYTES) | OUTAGE INFO (12 BYTES) |
|---|---|---|---|---|---|

*FIG. 3*

POWER OUTAGE DETECTION AND REPORTING

RELATED APPLICATION

This application claims priority to U.S. Prov. App. No. 62/854,553, titled "Managing Outage Detections and Reporting" and filed on May 30, 2019, which is incorporated herein in its entirety.

TECHNICAL FIELD

This disclosure relates generally to processes for detecting and reporting node outages (e.g., premise power outage or grid power outage) within a wireless network.

BACKGROUND

Networked systems, such as networks of smart power, gas, and water meters and other smart devices (i.e., devices capable of connecting to and communicating with other devices or networks), are capable of interconnecting with each other for inter-device communication. Further, one or more of the smart devices within the networked systems may be capable of interconnecting with the internet or other networks. For example, a networked system provides the smart devices with a mechanism to communicatively couple with one another and exchange data. The networked system may include one or more nodes that connect to a network (e.g., the internet or an intranet) either directly or indirectly through additional layers of parent and root nodes or collectors. The networked system may also include nodes that link with the parent nodes or other child nodes to exchange data across the networked system.

Certain issues arise with the reliability of outage detection and reporting for nodes within the networked system. For example, after losing power, a dying node may have some remaining energy to generate and transmit a network message to a headend system to report its power outage. However, the amount of energy that the node has might not be enough for it to generate and transmit a network message that includes all the required information by the networked system. In addition, if the power outage affects more than one node, the network node configured to route the network messages of the dying node to the headend system may also suffer a power outage and cannot function properly. As a result, the network message reporting the power outage of the dying node may never be received by other nodes in the networked system and reported to a headend system. Thus, outage events of nodes in the networked system may not be adequately or consistently detected and reported to the headend system for further remediating action.

SUMMARY

Aspects and examples are disclosed for apparatuses and processes for detecting and reporting node outage in a networked system of smart devices. For instance, a method for detecting and reporting a power outage of a node include a first node in a mesh network detecting that a power outage has occurred at the first node, determining that a predetermined period of time has passed since detecting the power outage and that power is not restored. The method further includes, in response to determining that the predetermined period of time has passed and that the power is not restored, broadcasting, by the first node after waiting for a random offset period of time, a last gasp packet on the mesh network. The last gasp packet is generated using a first packet format containing a smaller number of data units than a regular packet format used by the mesh network for communication. The method also includes receiving, by a second node in the mesh network, the last gasp packet. The second node is a neighboring node of the first node that is communicatively connected to the second node through the mesh network. The method further includes determining, by the second node, estimated time of the power outage based on time of receiving the last gasp packet and the predetermined period of time; generating, by the second node, an outage alarm message in the regular packet format used by the mesh network for communication based on the received last gasp packet and the estimated time of the power outage; and transmitting, by the second node, the outage alarm message to a headend system of the mesh network.

In another example, a system includes a first node of a mesh network, the first node configured for detecting that a power outage has occurred at the first node, determining that a predetermined period of time has passed since detecting the power outage and that the power is not restored, and in response to determining that the predetermined period of time has passed and that the power is not restored, broadcasting, after waiting for a random offset period of time, a last gasp packet on the mesh network. The last gasp packet is generated using a first packet format containing a smaller number of data units than a regular packet format used by the mesh network for communication. The system further includes a plurality of neighboring nodes of the first node that are communicatively connected to the first node through the mesh network. Each of the plurality of neighboring nodes is configured for receiving the last gasp packet from the first node, determining estimated time of the power outage based on time of receiving the last gasp packet and the predetermined period of time, generating an outage alarm message in the regular packet format used by the mesh network for communication based on the received last gasp packet and the estimated time of the power outage, and transmitting the outage alarm message to a headend system of the mesh network.

In a further example, a node of a network includes a processor configured to execute computer-readable instructions, and a memory configured to store the computer-readable instructions that, when executed by the processor, cause the processor to perform operations. The operations include receiving a last gasp packet from a dying node indicating a power outage at the dying node. The node is a neighboring node of the dying node that is communicatively connected to the node through the network. The last gasp packet is generated by the dying node after a predetermined period of time has passed since detecting the power outage and is broadcast on the network using a first packet format containing a smaller number of data units than a regular packet format used by the network for communication. The operations further include determining an estimated time of the power outage based on time of receiving the last gasp packet and the predetermined period of time, generating an outage alarm message in the regular packet format used by the network for communication based on the received last gasp packet and the estimated time of the power outage, and transmitting the outage alarm message to a headend system of the network.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE FIGURES

These and other features, aspects, and advantages of the present disclosure are better understood when the following Detailed Description is read with reference to the accompanying drawings.

FIG. 3 shows examples of a last gasp packet 118 and an outage alarm message 108, according to certain aspects of the disclosure.

DETAILED DESCRIPTION

Figure 1:
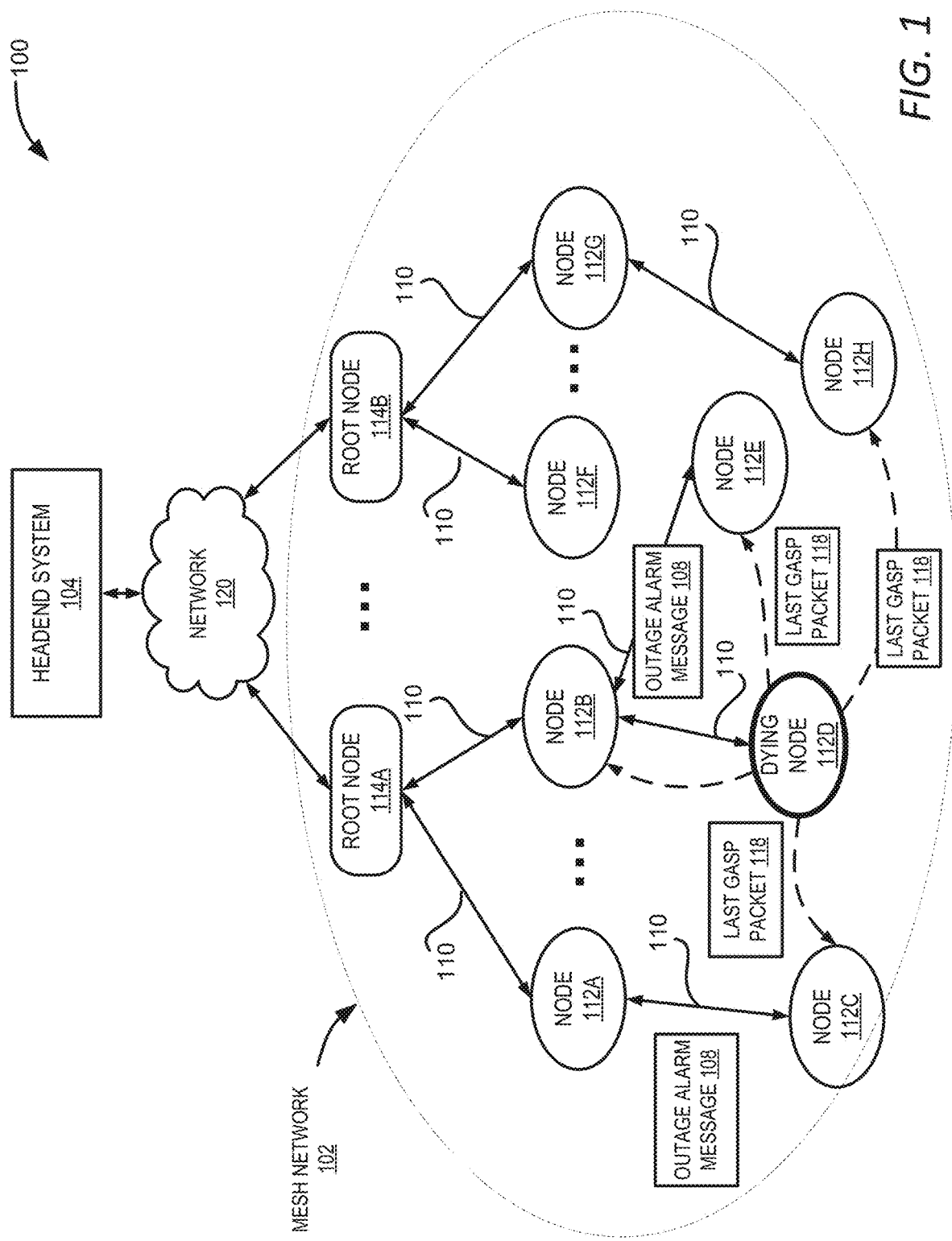
FIG. 1 is a block diagram showing an illustrative operating environment for detecting and reporting power outage of a node in a networked system, according to certain aspects of the disclosure.

Systems and methods are provided for node outage detection and reporting in a networked system of smart devices. As used herein, a node outage can include the premises power outage at the location of the node (e.g., the power outage only occurs at the premises level at the location of the node and affects a single node) or the grid power outage at the location of the node (e.g., the power outage occurs at the power grid level and can impact multiple premises and multiple nodes). Within the networked system, a node may be any point in the networked system capable of transmitting data to and receiving data from other nodes or a centralized network (e.g., the internet or an intranet). To provide proper accounting of statuses of the nodes connected to the networked system, the networked system includes a process that leverages node capabilities to manage node outage detection at the nodes connected to the networked system.

For example, a node may detect that it is experiencing a power outage. The node that suffers the power outage is also referred to herein as a "dying node" or a "non-functioning node." Upon detecting the power outage, the dying node may be able to operate for a short period of time before completely shutting down, such as by using energy stored in internal capacitors of the node. During this short period of time, the dying node can initiate an ordered shutdown process such as turning off various components of the dying node, saving relevant data to the storage device, and the like.

During this short period of time, the dying node can also generate a last gasp packet reporting its power outage. To reduce the power consumption of generating and transmitting the outage-reporting message, the last gasp packet is generated in a format that contains less data than a regular message used by the networked system for communication. For example, the last gasp packet can include only necessary information such as an indication of the packet as a last gasp packet and an identifier of the node. Other information that would otherwise be included in a regular outage alarm message, such as the time of the power outage, the destination information of the packet, can be omitted from the last gasp packet.

To avoid reporting a temporary or momentary power outage, the dying node can wait for a sustained period before sending out the last gasp packet. Further, a random offset time period can also be added to the waiting time to reduce the likelihood of the collision in transmitting the last gasp packet. In order to reach as many nodes as possible, the dying node can be configured to broadcast the last gasp packet through the network. Any neighboring node that can directly communicate with the dying node (including, but not limited to, the node configured for routing messages for the dying node) can receive the last gasp packet. In this way, the last gasp packet may be received by multiple neighboring nodes of the dying node thereby increasing the chances of the last gasp packet reaching a functioning node.

Each of the functioning neighboring nodes of the dying node that received the last gasp packet can convert the last gasp packet into an outage alarm message by following the regular format of the network message and transmit it to the headend system. To avoid transmission collision caused by multiple neighboring nodes transmitting the outage alarm message at the same time, each neighboring node can wait for a randomization period of time before transmitting the outage alarm message. In addition, to avoid duplicate outage alarm messages being transmitted to the headend system, each neighboring node can, during the randomization period of time, listen for outage alarm messages transmitted by other nodes. If an outage alarm message reporting the outage at the dying node has been transmitted by another node during the randomization period of time, the neighboring node will refrain from transmitting the outage alarm message. If no outage alarm messages have been transmitted by other nodes during the randomization period of time, the neighboring node will transmit the outage alarm message to a headend system through normal packet routing. After receiving the outage alarm message, the headend system can cause measures to be taken to address the non-functioning node. For example, technicians may be deployed to perform physical inspections and repairs on the non-functioning node. The information about the non-functioning nodes may also be used to provide accurate outage information to customers or to identify the scope of the problem.

When the power at the non-functioning node is recovered, this node has sufficient power and it can generate a power recovery message in the regular network message format and send the power recovery message to the headend system through normal packet routing to report its power recovery.

Techniques described in the present disclosure increases the reliability of the node power outage detection and reporting. For instance, by reducing the size of the last gasp packet, the energy consumption at the dying node for generating and transmitting the last gasp packet can be reduced thereby increasing the chance of the last gasp packet being successfully transmitted out using the limited energy of the dying node. In addition, broadcasting the last gasp packet instead of unicasting can increase the likelihood of the last gasp packet reaching a functioning node so that the power outage can be reliably reported to the headend system. Various other mechanisms, such as the random offset period added by the dying node before transmitting the last gasp packet, the randomization period of time during which a neighboring node listening for the outage alarm message reported by other nodes, can further reduce network transmission collision and increase the reliability of reporting the power outage of a node.

FIG. 1 is a block diagram illustrating an example of a networked system 100 and a mesh network 102. The networked system 100 and the mesh network 102 provides a network infrastructure for smart devices (e.g., resource consumption meters, vehicles, home appliances, etc. that include communication technology) to communicate across a network of nodes (i.e., other smart devices), the internet, and/or an intranet.

The networked system 100 includes a headend system 104, which may function as a central processing system that receives a stream of data from a network 120. The network 120 may be the internet, an intranet, or any other data communication network. The mesh network 102 may include various nodes 112A-112H (which may be referred to herein individually as a node 112 or collectively as the nodes 112). These nodes 112 include nodes such as measuring nodes for collecting data from the respective deployed location of the nodes, processing nodes for processing data available to the nodes, router nodes for forwarding data received from one node to another node in the mesh network 102, or nodes that are configured to perform a combination of these functions.

In one example, the mesh network 102 is associated with a power distribution network to deliver measurement data or other data obtained in the power distribution network. In this example, nodes 112 include electricity meters implemented to measure various operating characteristics of the power distribution network and to transmit the collected data through the mesh network 102 to root nodes 114A and 114B (which may be referred to herein individually as a root node 114 or collectively as the root nodes 114).

Root nodes 114 of the mesh network 102 may be configured for communicating with the nodes 112 to perform operations such as managing the nodes 112, collecting data from the nodes 112, and forwarding data to a headend system 104. A root node 114 can also be configured to function as a node to measure and process data itself. The root nodes 114 may be personal area network (PAN) coordinators, gateways, or any other devices capable of communicating with the headend system 104. The root nodes 114 ultimately transmit the generated and collected data to the headend system 104 via the network 120. In addition, the root nodes 114 may also receive from the headend system 104 network management messages and transmit the network management messages to the nodes 112. Likewise, the root node 114 itself or the nodes 112 may also issue and transmit network management messages to other nodes 112. The data and network management transmitted between nodes 114 and 112 may be collectively referred to herein as "communication messages." These communication messages are transmitted and routed through data links 110 between nodes 114 and 112. In some examples, the communication messages are generated in a regular format so that nodes 114 and 112 on the mesh network 102 can understand the communication messages and route them to the correct destination nodes or the headend system 104.

Communication messages are typically routed between a node and the headend system 104 or among the nodes according to a node hierarchy of the mesh network 102. For example, the root node 114A, which communicates directly with the headend system 104 through the network 120, may generally be referred to as a parent node due to data links with the nodes 112A and 112B that are located at a node layer (e.g., layer one) below the root node 114A. As illustrated, nodes 112A and 112B may also be referred to as parent nodes due to data links with nodes 112C, 112D, and 112E that are located at a node layer (e.g., layer two) below the nodes 112A and 112B. Likewise, nodes 114B and 112G may also be referred to as parent nodes due to the data link with nodes 112F-112G and node 112H, respectively, that are located at a node layer below the respective nodes. During the normal operations, the nodes 112 may all funnel information up through the node layers to the root node 114 and ultimately to the headend system 104.

Each of the nodes 112 and 114 is linked with at least one of the other nodes. Links 110 may be created by storing neighboring node information in neighbor caches of the nodes 112 and 114 that provide indications to the nodes of the other nodes through which data may be routed. For example, the neighbor cache of the node 112D may include neighboring node information identifying that data collected at the node 112D should be transmitted to the node 112B. Likewise, the neighbor cache of the node 112B may include neighboring node information identifying that the node 112B should transmit relevant information to the node 112D (e.g., network management messages or other information from the headend system 104) and also identifying that the node 112B should transmit data collected by the node 112B and data received from the node 112D to the root node 114A. Such a data transmission scheme may continue up through the node layers of the mesh network 102 if there are more node layers.

In operation, fewer or more nodes 112 may be included in the mesh network 102, and more root nodes 114 may also be included in the networked system 100. Additionally, while the mesh network 102 depicted in FIG. 1 includes a root node layer (i.e., the root node 114), layer one (i.e., the nodes 112A, 112B, 112F, and 112G), and layer two (i.e., the nodes 112C, 112D, 112E, and 112H), fewer or more node layers are also contemplated. Moreover, while FIG. 1 depicts a specific network topology (e.g., a DODAG tree topology), other network topologies are also possible (e.g., a ring topology, a mesh topology, a star topology, etc.).

The headend system 102 may keep track of the operational status of the nodes 114 and 112. To do so, each of the nodes 114 and 112 can be configured to report its status to the headend system 104. For example, if a node 114 or 112 experiences a power outage, this node can report the power outage to the headend system 104. If the power is recovered later at the node, the node can report the power recovery to the headend system 104. In the example shown in FIG. 1, the node 112D is experiencing a power outage (as such node 112D is also referred to as the dying node 112D). Upon detecting the power outage, the dying node 112D can generate a last gasp packet 118 to indicate the power outage. The dying node 112D can broadcast the last gasp packet 118 instead of sending it directly to node 112B according to the normal transmission procedure as discussed above. In this way, the last gasp packet 118 can reach multiple neighboring nodes of the dying node 112D that can directly communicate with the dying node 112D, such as nodes 112B, 112C, 112E, and 112H. In addition, the last gasp packet 118 may be generated in a format containing less data than the regular format used to transmit the communication messages.

Upon receiving the last gasp packet 118, each of the neighboring nodes that have not lost power and function normally can reformat the packet into an outage alarm message 108. The outage alarm message 108 can be generated by following the regular format of communication messages on the network 102 so that the outage alarm message 108 can be properly routed to the headend system 104. The neighboring node can transmit the outage alarm message 108 to the headend system 104 to report the power outage at the dying node 112D. For example, the neighboring node 112C can generate an outage alarm message 108 based on the last gasp packet 118 and send it to the headend system 104 through nodes 112A and 114A. In some examples, the outage alarm message 108 generated by the neighboring node is the same as an outage alarm message that otherwise would have been generated by the dying node. So the generation of the outage alarm message 108 is transparent to the rest of the system. Generating an outage alarm message 108 the same as an outage alarm message that otherwise would have been generated by the dying node based on the last gasp packet 118 sent by the dying node is referred to herein as a "proxy" function of the neighboring node. When performing the proxy function, the neighboring node is referred to as a proxy of the dying node.

In some examples, the outage alarm message 108 for the dying node 112D may be combined or consolidated with the outage alarm messages for other dying nodes in an alarm packet. The alarm packet can include an indication of multiple nodes that are in a power outage. Certain mechanisms can be implemented at each neighboring node to reduce the likelihood of more than one neighboring node sending the outage alarm message 108. Additional details of generating and sending the last gasp packet 118 and outage alarm message 108 are described with regard to FIGS. 2-4.

When an alarm packet or an outage alarm message is received at a node 112 or 114 in a next higher node level, a filtering and consolidation process may occur to prevent transmission of unnecessary or repeat outage indications. For example, the node 112 or 114 that receives the alarm packet may parse the alarm packet or outage alarm message into node identifiers that indicate which of the nodes 112 or 114 are in the alarm packet as being in an outage. The node can analyze the node identifiers for repeat alarm indications. For example, if the node receiving the alarm packet or the outage alarm message already knows that an alarm packet or an outage alarm message has already been sent, the node can remove the node identifier from the alarm packet or outage alarm message and forward the updated alarm packet or outage alarm message to the next topologically higher node layer of the mesh network 102. The root node 114 may also perform the filtering and consolidation process and transmit the resulting alarm packet to the headend system 104 by way of the network 120.

When the headend system 104 receives the alarm packet or the outage alarm message 108 from the root node 114, the headend system 104 may deploy technicians to address the one or more nodes indicated by the alarm packet as being in outage including the node 112D. For example, the technician may be deployed to repair or replace the nodes identified by the alarm packet or to address a cause of the outage. Further, the headend system 104 may maintain a record of the nodes that are in an outage.

If the power at the node 112D is recovered at a later time, the node 112D can generate a power recovery message using the regular format for communication messages and send the power recovery message to the headend system through node 112B and node 114A according to its normal routing path to report its power recovery.

Figure 2:
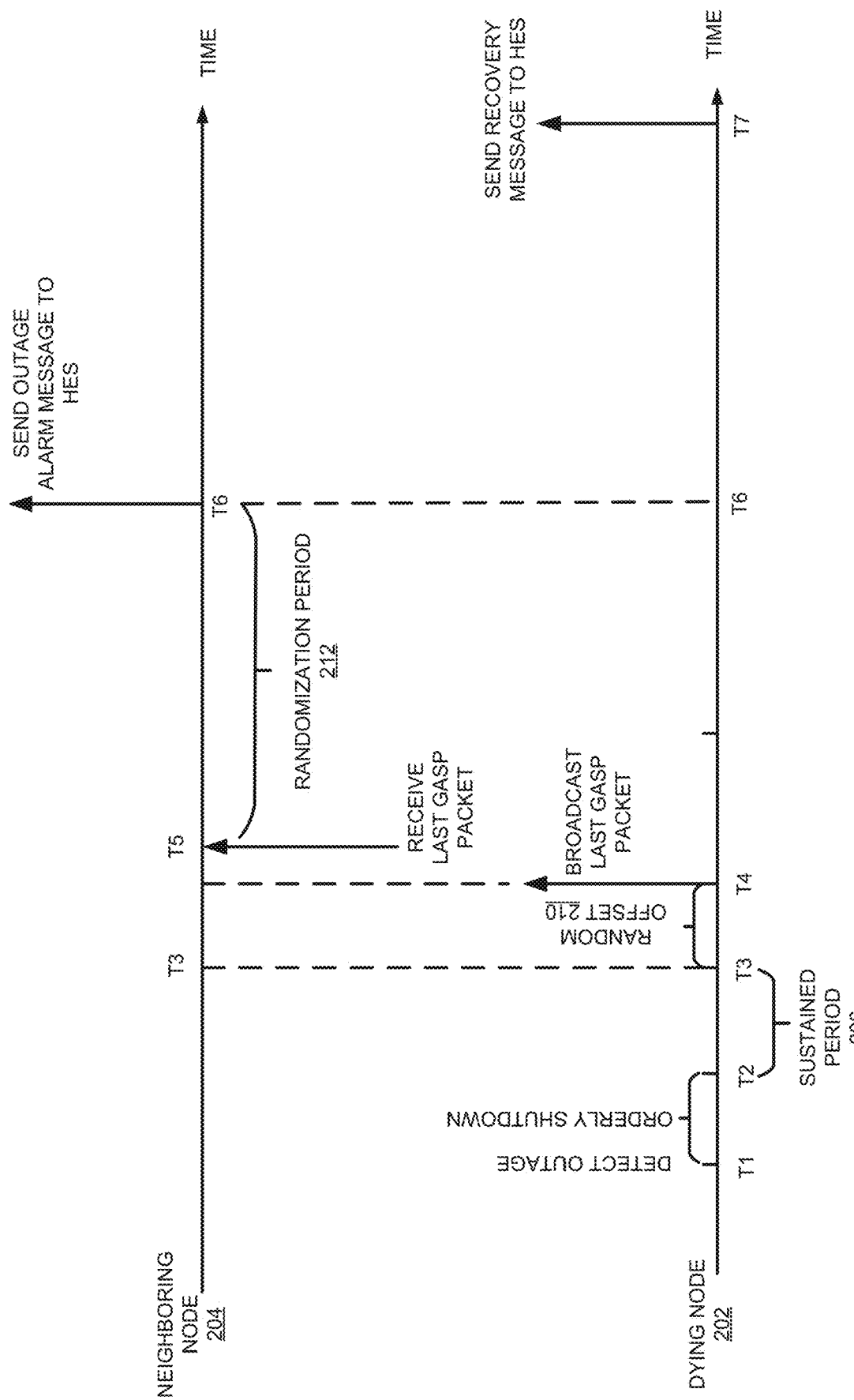
FIG. 2 is a diagram illustrating an example of a timeline for detecting and reporting the power outage of a node in a networked system, according to certain aspects of the disclosure.

FIG. 2 is a diagram illustrating an example of a timeline for detecting and reporting the power outage of a node in a networked system, according to certain aspects of the disclosure. FIG. 2 illustrates two synchronized time axes: the lower time axis is for a dying node 202 and the upper one is for a neighboring node 204 of the dying node 202. At time T1, the dying node 202 detects the power outage, and between time T1 and T2, the dying node 202 performs an orderly shutdown process. The orderly shutdown process can include orderly turning off components such as the receiver, and stopping communication functions, such as protocol activities, packet processing, and so on. Stopping these communications components and functions can help reduce energy usages. Additionally, other non-critical processor activities can also be shutdown including high-speed clocks. Only a low consumption timer used for counting the sustained period can be maintained powered, before sending the last gasp packet. In addition, context information can be stored in a nonvolatile storage device.

The dying node 202 can also generate a last gasp packet 118 for reporting its power outage. In some examples, the last gasp packet 118 is generated in a simplified format that contains fewer data units than the regular packet format used to generate the communication messages transmitted on the network. FIG. 3 shows an example of the last gasp packet 118 and an outage alarm message 108 if the power outage is reported by following the regular packet format. In this example, the last gasp packet 118 contains a last gasp information field containing necessary information used for reporting the outage, such as the identifier (ID) of the dying node 202. The last gasp packet 118 in this example also includes header fields such as physical layer (PHY) header and Media Access Control (MAC) layer header indicating that this packet is a last gasp packet 118 so that a receiving node knows to parse the packet according to the format of the last gasp packet 118. FIG. 3 also shows the example size of each field of the last gasp packet 118. In this example, the total size of a last gasp packet 118 is 25 bytes.

In comparison, the outage alarm message 108 that follows the regular packet format of the network may require more information and thus have a larger packet size. For example, the outage alarm message 108 can contain an outage information field describing the outage, such as the ID of the dying node, the timestamp indicating the time when the power outage occurred, and so on. Further, in order for the outage alarm message 108 to be properly routed to the headend system 104, the outage alarm message 108 may also need proper headers for different network layers, such as the PHY header, MAC header, IP header, UDP header, application header, and the like. Other fields may also be included in the outage alarm message 108. In the example shown in FIG. 3, the size of an outage alarm message 108 is 47 bytes, which is almost twice the size of the last gasp packet 118. As can be seen from FIG. 3, compared with the outage alarm message 108 that follows the regular packet format of the network, the last gasp packet 118 has a simple packet structure and a smaller size. As a result, a dying node 202 needs much less energy to generate and transmit a last gasp packet 118 than an outage alarm message 108.

Referring back to FIG. 2, before sending out the last gasp packet 118, the dying node 202 waits for a sustained period 206 (the time period from time T2 to T3), this helps to avoid reporting a momentary power outage. The sustained period of time may be set to several seconds to a minute. The sustained period of time can be predetermined by an entity associated with the headend system, such as a utility company. At the end of the sustained time period 206 (i.e., time T3), if the power is not restored and the dying node 202 is still in the power outage, the dying node 202 may determine that the power outage is not momentary and it can send the last gasp packet 118.

In some cases, however, the power outage may impact a large area causing multiple nodes 114 and 112 to lose power. In that case, if a dying node 202 sends the last gasp packet 118 right after the expiration of the sustained period 206, collisions may occur between multiple dying nodes. To reduce the likelihood of collisions, the dying node 202 can be configured to add a random offset period 210 (i.e., the time period between T3 and T4) before transmitting the last gasp packet 118. In other words, after the sustained period 206 expires at time T3, the dying node 202 waits for another time period (i.e., the random offset 210) before sending out the last gasp packet 118. The random offset 210 can be randomly generated by the dying node 202 within a last gasp randomization range. In some examples, the last gasp randomization range can be 1 to 5 seconds. The dying node 202 can randomly select a value within this range to use as the random offset period 210. The selection can follow a uniform distribution over the last gasp randomization range or other types of distributions.

At the end of the random offset period 210 (i.e., time T3), the dying node 202 can send the last gasp packet 118 through broadcasting. The broadcast last gasp packet 118 may reach each of the neighboring nodes of the dying node 202 that are within the communication range of the dying node 202 and are still functioning, such as the neighboring node 204. The time when the neighboring node 204 revives the last gasp packet 118 is denoted as time T5 in FIG. 2. Since the neighboring node 204 is functioning and has sufficient power, the neighboring node 204 can convert the last gasp packet 118 into an outage alarm message 108 that follows the regular format for communication messages transmitted through the network, such as the outage alarm message 108 shown in FIG. 3. The neighboring node 204 can transmit the outage alarm message 108 to the headend system 104 through the node layers of the network as discussed above with regard to FIG. 1.

Note that in some scenarios, a neighboring node that is also experiencing a power outage (also referred to as a dying neighboring node) may also receive the last gasp packet 118 sent by the dying node 202 (e.g., if the receiver is not turned off during the orderly shutdown procedure). In those scenarios, the dying neighboring node can ignore the received last gasp packet 118 and perform a process to handle its own power outage detection and reporting in a way similar to that of the dying node described herein.

Because it is likely that the last gasp packet 118 reaches multiple neighboring nodes, network collision may occur if these neighboring nodes send the generated outage alarm message 108 at around the same time. To reduce the possibility of the network collision, the neighboring node 204 can be configured to wait for a randomization period of time 212 before sending out the outage alarm message 108. The randomization period of time 212 can be randomly selected by the neighboring node 204 within an outage alarm randomization range. In some examples, the outage alarm randomization range can be from 0 to 15 seconds. The neighboring node 204 can randomly select a value within this range to use as the randomization period 212. The selection can follow a uniform distribution over the last gasp randomization range or other types of distributions. When selecting the randomization period of time 212, different neighboring nodes 204 may follow the same or different distributions.

During the randomization period of time 212, the neighboring node 204 can listen on the network for outage alarm messages 108 reporting the power outage of the same dying node 202. If the neighboring node 204 detects that an outage alarm message 108 has been sent by another node to report the power outage of the dying node 202, the neighboring node 204 will refrain from sending the outage alarm message 108 to the headend system 104 to avoid duplicate power outage reporting. If the neighboring node 204 did not detect other outage alarm message 108 on the network during the randomization period of time 212, the neighboring node 204 can transmit the generated outage alarm message 108 at the end of the randomization period of time 212, denoted as T6 in FIG. 2. It should be understood that, depending on the type of network and relative node locations, in some cases, the node in the network cannot detect and parse communication messages. In those cases, the neighboring node 204 may not be able to determine whether an outage alarm message 108 has been sent by another node or not. The neighboring node 204 will send the outage alarm message 108 after the randomization period of time 212 has passed. Removing duplicate outage alarm messages 108 can be performed by nodes at higher layers in the network as discussed above with regard to FIG. 1.

As can be seen from the above process, instead of the dying node 202 generating and sending the outage alarm message 108 to the headend system 104, the dying node 202 relies on its neighboring nodes which have more energy to generate and send the outage alarm message 108 on its behalf. The dying node 202 can use its limited energy to focus on generating and transmitting the smaller and simpler last gasp packet 118 without complying with the regular packet format of the network. This increases the chances of the successful generation and transmission of the dying node 202 before the dying node 202 completely shuts down.

If at a later time (such as at time T7), the power of the dying node 202 is recovered, the dying node 202 can generate a power recovery message in the regular format of communication message and send the power recovery message to the headend system 104 itself without using its neighboring nodes as a proxy.

In the example shown in FIG. 2, the dying node 202 waits for the sustained period 206 before sending the last gasp packet 118 in order to rule out the scenarios of momentary power loss. In some cases, however, the remaining energy of the dying node 202 after power loss may not last long enough to allow it to wait for the sustained period 206 in addition to the random offset 210. As such, in some implementations, the dying node 202 is configured to skip the sustained period 206. In other words, after detecting the power outage and performing the ordered shutdown procedure, the dying node 202 only waits for the random offset time period before broadcasting the dying node 202. The neighboring nodes can be configured to wait for a sustained period of time, which can be the same or different from the sustained period 206, before proceeding to the next step of generating the outage alarm message 108 and listening on the network for other outage alarm messages 108 during the randomization period of time 212. For example, the sustained period used at the neighboring node 204 may vary from several tens of seconds to several minutes. If the neighboring node 204 does not receive further packets from the dying node 202 during the sustained period, the neighboring node 204 can determine that the power outage is not momentary and will proceed to the next step of the power outage reporting described above (e.g., generating the outage alarm message 108 and waiting for the randomization period of time 212). If the neighboring node 204 receives further packets from the dying node 202 during the sustained period, the neighboring node 204 can determine that the power outage is momentary and can ignore the previously received last gasp packet 118.

In further examples, in addition to adding a sustained period, the neighboring node 204 can also communicate with other nodes on the network to verify that the dying node 202 indeed lost power. For example, the neighboring node 204 can send a request to other nodes on the network to confirm if any of these other nodes has received any message from the dying node 202 during the sustained period. If so, the neighboring node 204 can cancel the generation of the outage alarm message 108; otherwise, the neighboring node 204 can proceed with generating and sending the outage alarm message 108 as described above. In this way, the false-positive rate of reporting the power outage can be further reduced. Various other ways can also be utilized to verify the status of the dying node 202.

Figure 4:
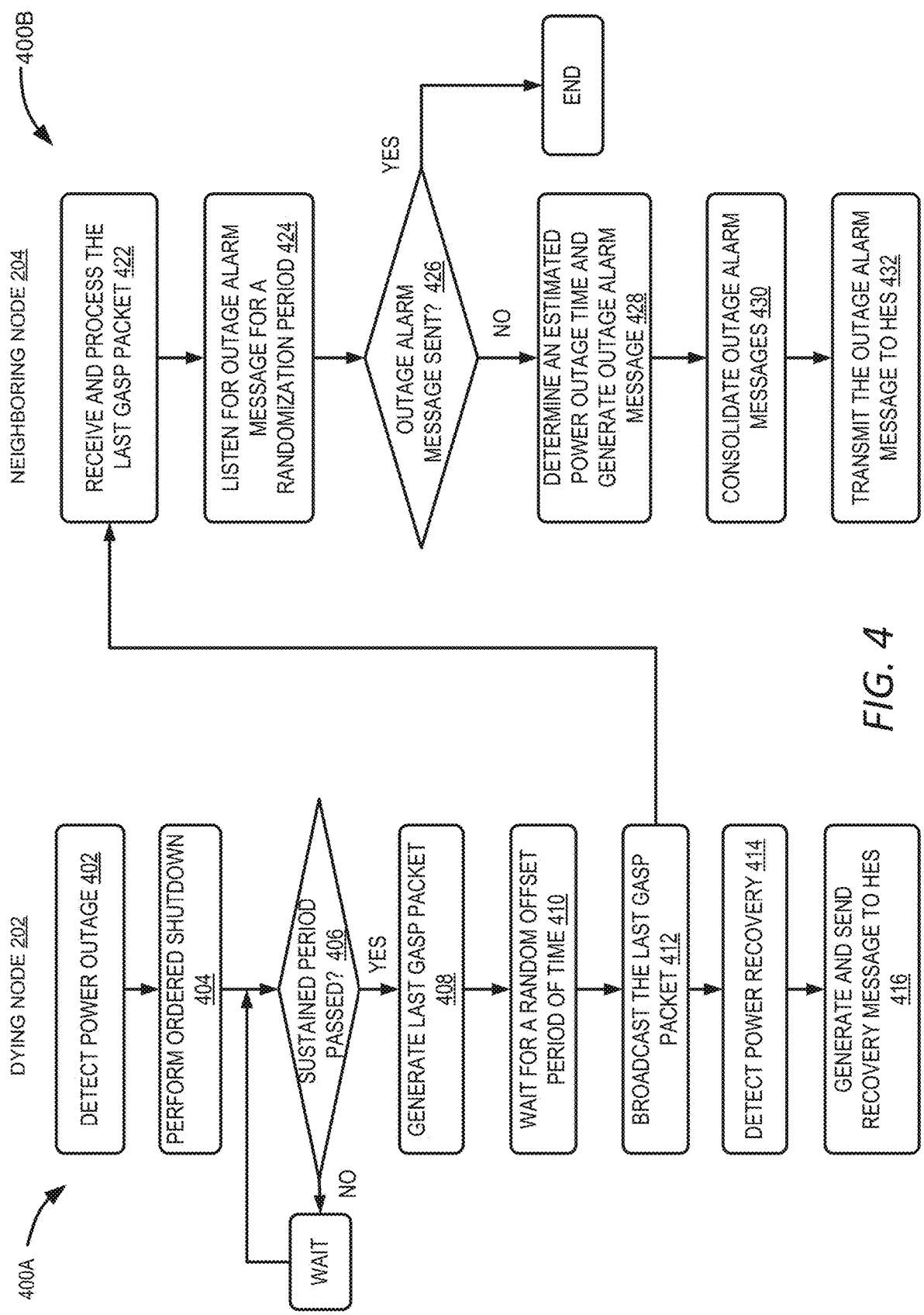
FIG. 4 shows several flow diagrams that illustrate several processes for detecting and reporting node outages in a networked system, according to certain aspects of the disclosure.

FIG. 4 shows several flow diagrams that illustrate several processes for detecting and reporting node outages in a networked system, according to certain aspects of the disclosure. In particular, the process 400A illustrates aspects of the dying node 202, and the routine 400B illustrates aspects of the neighboring node 204 with regard to the embodiment described above with regard to FIGS. 1-3. The processes 400A and 400B will be described together below.

At block 402, the process 400A involves the dying node 202 detecting the power outage. The power outage may be detected by a sensing circuitry of the dying node 202. Upon detecting the power outage, the dying node 202 may initiate an ordered shutdown process, such as turning off various components of the dying node, saving relevant data to the storage device, and so on. At block 406, the process involves determining whether a pre-determined sustained period of time has passed since the dying node 202 detects the power outage. This can help to determine whether the power outage is a momentary outage or a sustained outage. The sustained period of time may be set to several seconds. If the pre-determined sustained period of time has not passed, the dying node 202 continues to wait.

If the pre-determined sustained period of time has passed and the power at the dying node 202 has not recovered, the process 400A involves generating a last gasp packet at block 408. As discussed in detail above with regard to FIGS. 2 and 3, the outage alarm message 108 can be generated in a simplified format that contains fewer data units than the regular packet format used to generate the communication messages transmitted on the network, such as the last gasp packet 118 shown in FIG. 3. To avoid communication collision among multiple dying nodes, the dying node 202 can wait for a random offset period 210 at block 410. The random offset period 210 is randomly selected by the dying node 202 from an offset range independently from other nodes in the network. As such, if there are multiple dying nodes in the area near the dying node 202, the random offset periods selected by these multiple dying nodes are likely to be different, thereby offsetting the transmission of the last gasp packets from these dying nodes.

After waiting for the random offset period, at block 412, the dying node 202 can broadcast the outage alarm message 108 generated at block 408. At block 422, the process 400B involves the neighboring node 204 receiving the last gasp packet 118 broadcast by the dying node 202. The neighboring node 204 can further process the last gasp packet 118 by parsing the various fields of the last gasp packet 118. For example, the neighboring node 204 can determine from the headers of the last gasp packet 118 that the received packet is a last gasp packet 118. The neighboring node 204 can further determine the identifier of the dying node 202 from the last gasp information field of the last gasp packet 118.

In response to determining that the received packet is a last gasp packet 118, at block 424, the neighboring node 204 randomly selects a randomization period and listens on the network for outage alarm messages reporting the power outage of the dying node 202 during the randomization period. The randomization period of time is selected independently from the random offset period of time. At block 426, the neighboring node 204 determines whether an outage alarm message 108 has been sent for the dying node 202. For example, the determination can be made by the neighboring node 204 listening to the network and detecting a message that has the format of an outage message and contains the ID of the dying node. If so, the neighboring node 204 drops the last gasp packet 118 and the process 400B ends.

If no outage alarm message 108 has been detected for the dying node 202 during the randomization period, the neighboring node 204 generates the outage alarm message 108 at block 428. If the last gasp packet 118 does not include the time information about the power outage, the neighboring node 204 can determine an estimated power outage time for the dying node 202. For example, the neighboring node 204 can estimate the power outage time by subtracting the sustained time period 206 from the time when the neighboring node 204 receives the last gasp packet 118. In further examples, the neighboring node 204 may also remove the random offset from the estimated time of the outage, for example, by subtracting the average random offset therefrom based on the distribution of the random offsets. The estimated time of power outage, the node ID, and other information can be utilized to generate the outage alarm message 108.

At block 430, the process 400B involves the neighboring node 204 consolidating multiple outage alarm messages. For example, if the neighboring node 204 received multiple last gasp packet 118 from neighboring nodes or multiple outage alarm messages 108 from nodes in a layer lower than the neighboring node 204, the neighboring node 204 can combine the outage information as discussed above with regard to FIG. 1 to remove any duplicate information to generate an alarm packet. For example, an alarm packet can be generated similar to the outage alarm message 108 shown in FIG. 3, but include a larger outage information field containing multiple node IDs and their associated outage timestamps to report the outage of multiple dying nodes. At block 432, the neighboring node 204 can transmit the outage information in an outage alarm message 108 (if no consolidation is performed) or an alarm packet (if consolidation is performed) to the headend system 104 as a proxy of the dying node 202 at block 432.

At block 414, the process 400A involves the dying node 202 detecting that the power is recovered. At block 416, the dying node 202 generates and sends a recovery message to the headend system reporting that the power of the dying node 202 has been restored.

It should be understood that the processes 400A and 400B are provided for illustration only and should not be construed as limiting. Certain blocks in FIG. 4 may be omitted or skipped and other blocks not shown FIG. 4 may be involved when determining and reporting the power outage of a dying node. For example, the consolidation performed in block 430 may be skipped and the neighboring node 204 may be configured to generate the outage alarm message 108 just for the dying node 202 and transmit it to the headend system 104. The consolidation can be performed by nodes in a higher layer of the network. Further as discussed above, the dying node 202 may skip block 406 (thus skipping the sustained period) and the process 400B may include a block for the neighboring node 204 to wait for a sustained period to determine whether the power outage is momentary.

In addition, although FIG. 4 shows the operations of the dying node 202 and neighboring node 204 in a certain order, the operations may be executed in a different order. For example, the dying node 202 may execute block 408 to generate the outage alarm message 108 before or during the sustained period. Likewise, the neighboring node 204 may execute block 428 to estimate the power outage time and generate the power outage message before or during the randomization period. Other ways of implementing the techniques presented herein are also possible.

Exemplary Node

Figure 5:
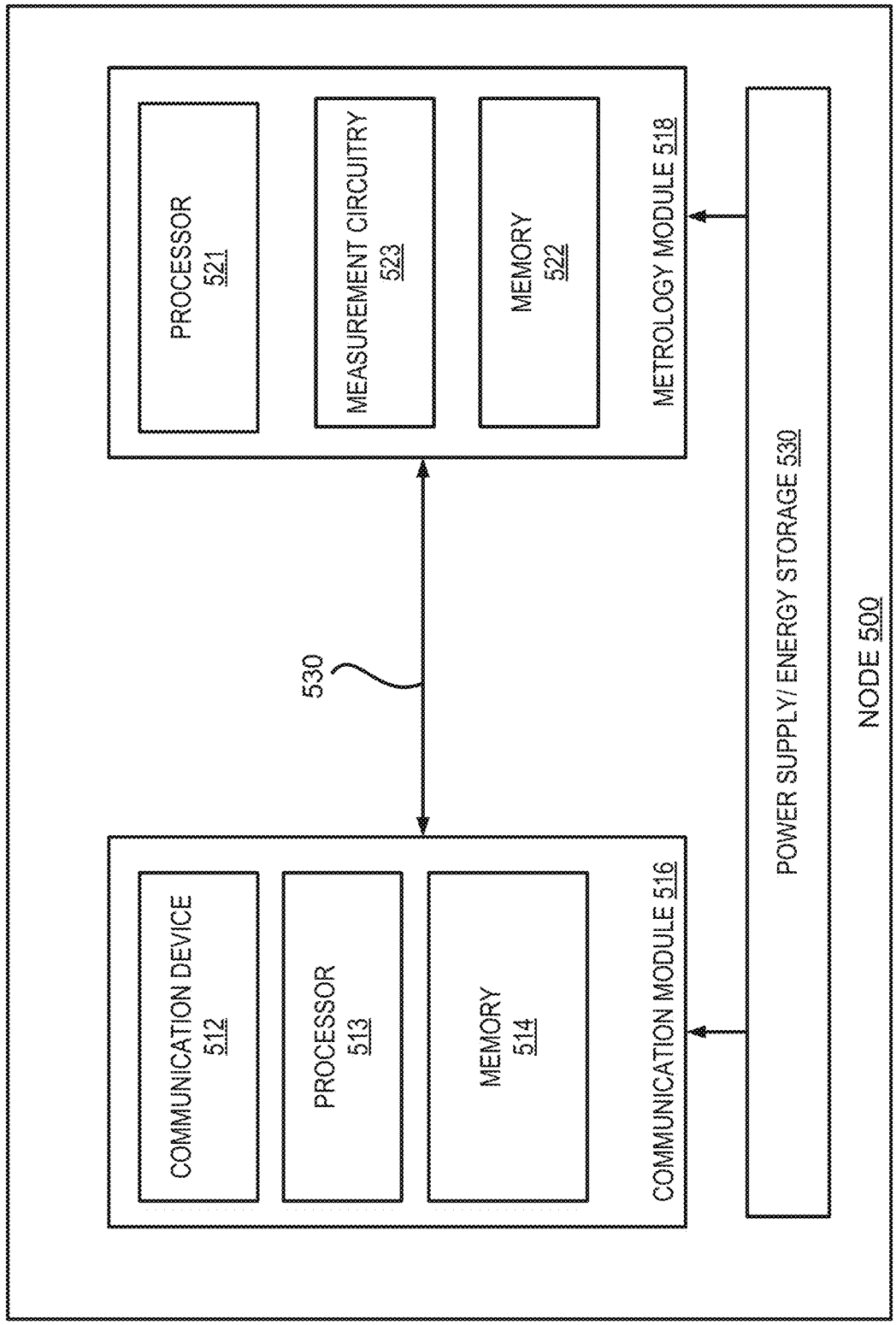
FIG. 5 is an example of a block diagram of a node of the networked system of FIG. 1, according to certain aspects of the disclosure.

FIG. 5 is an example of a block diagram of components of a node 114 or 112 of the mesh network 102. Some or all of the components of a computing system 500 can belong to one or more of the nodes 114 or 112 of FIG. 1. The node 500 includes a communication module 516 and a metrology module 518 connected through a local or serial connection 530. The function of the communication module 516 includes sending and receiving various signals to and from other nodes in the mesh network 102, such as last gasp packets, outage alarm messages, alarm packets, and other network communication messages.

The communication module 516 may include a communication device 512 such as an antenna and a radio. Alternatively, the communication device 512 may be any device that allows wireless or wired communication. The communication device 512 may include a transceiver device, such as an RF transceiver, capable of transmitting and receiving RF communication from other nodes in the mesh network 102. The communication module 516 may also include a processor 513, and memory 514. The processor 513 controls functions performed by the communication module 516, such as the one or more of the operations described above with respect to FIGS. 1-4. The memory 514 may be utilized to store data used by the processor 513 to perform its function.

The function of the metrology module 518 includes the functions necessary to manage the resource, in particular, to allow access to the resource and to measure the resource used. The metrology module 518 may include a processor 521, memory 522, and measurement circuitry 523. The measurement circuitry 523 handles the measuring of the resource and may be used as the sensor to collect sensor data. The processor 521 in the metrology module 518 controls functions performed by the metrology module 518. The memory 522 stores data needed by the processor 521 to perform its functions. The metrology module 518 may also include sensing circuitry, such as in the measurement circuitry 523, for sensing the power status of the node 500. The communication module 516 and the metrology module 518 communicate with each other through the local connection 530 to provide data needed by the other module, including the power status data. Both the communication module 516 and the metrology module 518 may include computer-executable instructions stored in memory or in another type of computer-readable medium and one or more processors within the modules may execute the instructions to provide the functions described herein.

The node 500 also includes a power supply/energy storage module 530 that is configured to provide energy to the communication module 516 and the metrology module 518. The power supply/energy storage module 530 is connected to a power supply to continuously provide power to the communication module 516 and the metrology module 518. When power outage occurs (i.e., the power supply no longer provides power to the node 500), the power supply/energy storage module 530 can provide its stored energy (such as the energy stored in the capacitors of the power supply/energy storage module 530) to the communication module 516 and the metrology module 518 to perform the operations described herein, such as orderly shutting down the node 500, generating and transmitting the last gasp packet 118, and so on.

General Considerations

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The features discussed herein are not limited to any particular hardware architecture or configuration. A computing device can include any suitable arrangement of components that provide a result conditioned on one or more inputs. Suitable computing devices include multipurpose microprocessor-based computer systems accessing stored software (i.e., computer-readable instructions stored on a memory of the computer system) that programs or configures the computing system from a general-purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied; for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

The invention claimed is:

1. A method for detecting and reporting a power outage of a node, the method comprising:
   detecting, by a first node in a mesh network, that a power outage has occurred at the first node;
   determining, by the first node, that a predetermined period of time has passed since detecting the power outage and that power is not restored;
   in response to determining that the predetermined period of time has passed and that the power is not restored, broadcasting, by the first node after waiting for a random offset period of time, a last gasp packet on the mesh network, wherein the last gasp packet is generated using a first packet format containing a smaller number of data units than a regular packet format used by the mesh network for communication and the last gasp packet comprises an identifier of the first node and an indication of the last gasp packet as a last gasp packet;

receiving, by a second node in the mesh network, the last gasp packet, wherein the second node is a neighboring node of the first node that is communicatively connected to the second node through the mesh network;

determining, by the second node, estimated time of the power outage based on time of receiving the last gasp packet and the predetermined period of time;

generating, by the second node, an outage alarm message in the regular packet format used by the mesh network for communication based on the received last gasp packet and the estimated time of the power outage; and transmitting, by the second node, the outage alarm message to a headend system of the mesh network.

2. The method of claim 1, wherein
the outage alarm message comprises the identifier of the first node and a timestamp indicating the estimated time of the power outage at the first node.

3. The method of claim 1, further comprising:
prior to transmitting the outage alarm message to the headend system of the mesh network, listening, by the second node during a randomization period of time, for another outage alarm message reporting the power outage at the first node transmitted by another node in the mesh network;

in response to detecting no other outage alarm messages are transmitted on the mesh network, transmitting, by the second node after the randomization period of time is over, the outage alarm message to the headend system; and in response to detecting another outage alarm message is transmitted on the mesh network, refraining, by the second node, from transmitting the outage alarm message to the headend system.

4. The method of claim 1, wherein determining the estimated time of the power outage comprises subtracting the predetermined period of time from the time of receiving the last gasp packet as the time of the power outage.

5. The method of claim 1, further comprising:
prior to broadcasting the last gasp packet, shutting down the first node by performing one or more of saving context information to a nonvolatile storage device or turning off components of the first node.

6. The method claim 1, wherein transmitting the outage alarm message to the headend system comprises:
combining, by the second node, a plurality of outage alarm messages including the outage alarm message into an alarm packet; and transmitting, by the second node, the alarm packet to the headend system.

7. The method of claim 1, further comprising:
detecting, by the first node, that the power is restored at the first node; and transmitting, by the first node, a power recovery message using the regular packet format to the headend system of the mesh network.

8. A system, comprising:
a first node of a mesh network, the first node configured for:
detecting that a power outage has occurred at the first node;

determining that a predetermined period of time has passed since detecting the power outage and that the power is not restored; and in response to determining that the predetermined period of time has passed and that the power is not restored, broadcasting, after waiting for a random offset period of time, a last gasp packet on the mesh network, wherein the last gasp packet is generated using a first packet format containing a smaller number of data units than a regular packet format used by the mesh network for communication and the last gasp packet comprises an identifier of the first node and an indication of the last gasp packet as a last gasp packet; and a plurality of neighboring nodes of the first node that are communicatively connected to the first node through the mesh network, wherein each of the plurality of neighboring nodes is configured for:
receiving the last gasp packet from the first node;
determining estimated time of the power outage based on time of receiving the last gasp packet and the predetermined period of time;
generating an outage alarm message in the regular packet format used by the mesh network for communication based on the received last gasp packet and the estimated time of the power outage; and
transmitting the outage alarm message to a headend system of the mesh network.

9. The system of claim 8, wherein each of the plurality of neighboring nodes is further configured for:
prior to transmitting the outage alarm message to the headend system of the mesh network, listening, during a randomization period of time, for another outage alarm message reporting the power outage at the first node transmitted by another node in the mesh network;

in response to detecting no other outage alarm messages are transmitted on the mesh network, transmitting, after the randomization period of time is over, the outage alarm message to the headend system; and in response to detecting another outage alarm message is transmitted on the mesh network, refraining from transmitting the outage alarm message to the headend system.

10. The system of claim 9, wherein the random offset period of time is selected from a first range of time periods and the randomization period of time is selected from a second range of time periods, and the random offset period of time is selected independently from the randomization period of time.

11. The system of claim 8, wherein
the outage alarm message comprises the identifier of the first node and a timestamp indicating the estimated time of the power outage at the first node.

12. The system of claim 8, wherein determining the estimated time of the power outage comprises subtracting the predetermined period of time from the time of receiving the last gasp packet as the time of the power outage.

13. The system of claim 8, wherein the first node is further configured for:
detecting that the power is restored at the first node; and
transmitting a power recovery message using the regular packet format to the headend system of the mesh network.

14. The system of claim 8, wherein the first node is further configured for:
prior to broadcasting the last gasp packet, shutting down the first node by performing one or more of saving context information to a nonvolatile storage device or turning off components of the first node.

15. A node of a network, comprising:
a processor configured to execute computer-readable instructions; and
a memory configured to store the computer-readable instructions that, when executed by the processor, cause the processor to perform operations comprising:
receiving a last gasp packet from a dying node indicating a power outage at the dying node, wherein:
the node is a neighboring node of the dying node that is communicatively connected to the node through the network, and
the last gasp packet is generated by the dying node after a predetermined period of time has passed since detecting the power outage and is broadcast on the network using a first packet format containing a smaller number of data units than a regular packet format used by the network for communication and the last gasp packet comprises an identifier of the dying node and an indication of the last gasp packet as a last gasp packet;
determining an estimated time of the power outage based on time of receiving the last gasp packet and the predetermined period of time;
generating an outage alarm message in the regular packet format used by the network for communication based on the received last gasp packet and the estimated time of the power outage; and
transmitting the outage alarm message to a headend system of the network.

16. The node of claim 15, wherein the operations further comprise:
prior to transmitting the outage alarm message to the headend system of the network, listening, during a randomization period of time, for another outage alarm message reporting the power outage at the dying node transmitted by another node in the network;
in response to detecting no other outage alarm messages are transmitted on the network, transmitting, after the randomization period of time is over, the outage alarm message to the headend system; and
in response to detecting another outage alarm message is transmitted on the network, refraining from transmitting the outage alarm message to the headend system.

17. The node of claim 15, wherein the last gasp packet is broadcast by the dying node after waiting for a random offset period of time after the predetermined period of time has passed since detecting the power outage.

18. The node of claim 15, wherein
the outage alarm message comprises the identifier of the dying node and a timestamp indicating the estimated time of the power outage at the dying node.

19. The node of claim 15, wherein determining the estimated time of the power outage comprises subtracting the predetermined period of time from the time of receiving the last gasp packet as the time of the power outage.

20. The node claim 15, wherein transmitting the outage alarm message to the headend system comprises:
combining a plurality of outage alarm messages including the outage alarm message into an alarm packet; and
transmitting the alarm packet to the headend system.

* * * * *